United States Patent
Ng et al.

(10) Patent No.: US 8,918,696 B2
(45) Date of Patent: *Dec. 23, 2014

(54) IMPLEMENTATION OF LDPC SELECTIVE DECODING SCHEDULING

(75) Inventors: Kin Man Ng, Cupertino, CA (US); Kwok W. Yeung, Milpitas, CA (US); Lingqi Zeng, Turlock, CA (US); Yu Kou, San Jose, CA (US); Aditi R. Ganesan, Sunnyvale, CA (US)

(73) Assignee: SK hynix memory solutions inc., San Jose, CA (US)

( * ) Notice: Subject to any disclaimer, the term of this patent is extended or adjusted under 35 U.S.C. 154(b) by 215 days.

This patent is subject to a terminal disclaimer.

(21) Appl. No.: 13/084,022

(22) Filed: Apr. 11, 2011

(65) Prior Publication Data

US 2011/0252294 A1  Oct. 13, 2011

Related U.S. Application Data

(60) Provisional application No. 61/342,141, filed on Apr. 9, 2010.

(51) Int. Cl.
*H03M 13/00* (2006.01)
*H03M 13/11* (2006.01)

(52) U.S. Cl.
CPC .......... *H03M 13/114* (2013.01); *H03M 13/116* (2013.01)
USPC .......................................... 714/758; 714/804

(58) Field of Classification Search
CPC . H03M 13/09; H03M 13/091; H03M 13/114; H03M 13/116; H04L 1/0061; H04L 1/0057; H04L 1/0045; H04L 1/004; G06F 11/1076; G06F 11/1008; G06F 11/10; G11B 20/1833
See application file for complete search history.

(56) References Cited

U.S. PATENT DOCUMENTS

| | | | | |
|---|---|---|---|---|
| 7,536,623 | B2 * | 5/2009 | Kim et al. | 714/752 |
| 8,219,873 | B1 * | 7/2012 | Ng et al. | 714/752 |
| 8,291,285 | B1 * | 10/2012 | Varnica et al. | 714/752 |
| 2004/0194007 | A1 * | 9/2004 | Hocevar | 714/801 |
| 2005/0091565 | A1 | 4/2005 | Eroz et al. | |
| 2006/0156179 | A1 | 7/2006 | Shen et al. | |

(Continued)

FOREIGN PATENT DOCUMENTS

WO  2008012318  1/2008

OTHER PUBLICATIONS

Juntan Zhang et al., Shuffled Iterative Decoding, IEEE Transactions on Communications, vol. 53, No. 2, Feb. 2005, pp. 209-213.*

(Continued)

*Primary Examiner* — Albert Decady
*Assistant Examiner* — Enamul M Kabir
(74) *Attorney, Agent, or Firm* — Van Pelt, Yi & James LLP

(57) ABSTRACT

A method for decoding data is disclosed. The method includes partitioning a low-density parity check (LDPC) matrix into a plurality of groups, each comprising one or more check node layers. The method further includes selecting one of the groups based at least in part on a cost function, the cost function based at least in part on information associated with a variable node, or information associated with a check node, or both. The method further includes performing LDPC layered decoding on the selected group.

23 Claims, 15 Drawing Sheets

(56) References Cited

U.S. PATENT DOCUMENTS

| | | |
|---|---|---|
| 2006/0178755 A1* | 8/2006 | Ling et al. .......................... 700/1 |
| 2007/0033483 A1* | 2/2007 | Jeong et al. ................... 714/758 |
| 2007/0245217 A1 | 10/2007 | Valle |
| 2008/0028274 A1* | 1/2008 | Lin ............................... 714/752 |
| 2008/0104474 A1* | 5/2008 | Gao et al. ..................... 714/752 |
| 2008/0109708 A1 | 5/2008 | Kim et al. |
| 2008/0276156 A1 | 11/2008 | Gunnam et al. |
| 2008/0301521 A1 | 12/2008 | Gunnam et al. |
| 2009/0013237 A1 | 1/2009 | Lin et al. |
| 2009/0019333 A1* | 1/2009 | McEvoy et al. ............... 714/752 |
| 2009/0222710 A1 | 9/2009 | Patapoutian et al. |
| 2009/0313525 A1* | 12/2009 | Savin et al. ................... 714/752 |
| 2009/0327847 A1 | 12/2009 | Shen et al. |
| 2010/0042891 A1* | 2/2010 | Gunnam et al. .............. 714/752 |
| 2010/0042897 A1 | 2/2010 | Han et al. |
| 2010/0251064 A1* | 9/2010 | Shen et al. ..................... 714/752 |

OTHER PUBLICATIONS

David Declercq et al., Extended MinSum Algothrithm for Decoding LDPC Codes over GF(q), IEEE Information Theory, 2005. ISIT 2005. Proceedings. International Symposium on Sep. 4-9, 2005, pp. 1-5.*

Ming Jiang et al., An Improvement on the Modified Weighted Bit Flipping Decoding Algorithm for LDPC Codes, IEEE Communications Letters, vol. 9, No. 9, Sep. 2005, pp. 814-816.*

David Declercq et al., Decoding Algorithm for Nonbinary LDPC Codes over GF(q), IEEE Transactions on Communications, vol. 55, No. 4, Apr. 2007, pp. 633-643.*

* cited by examiner

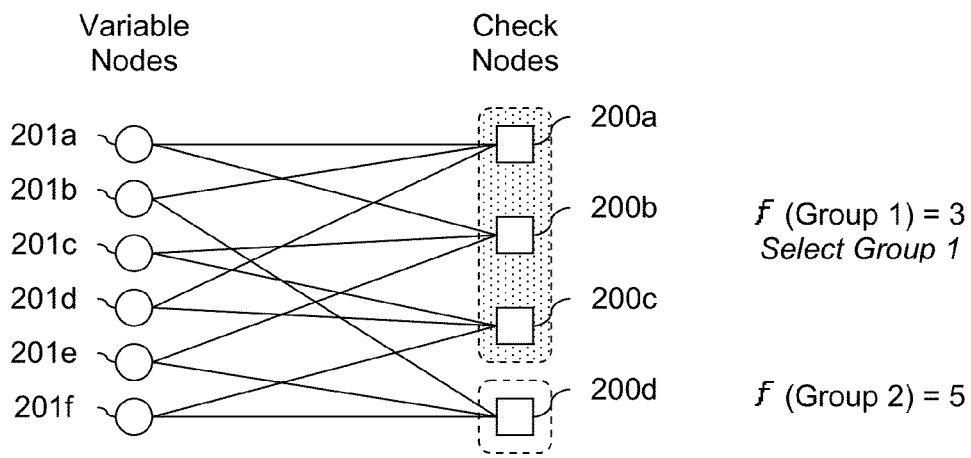
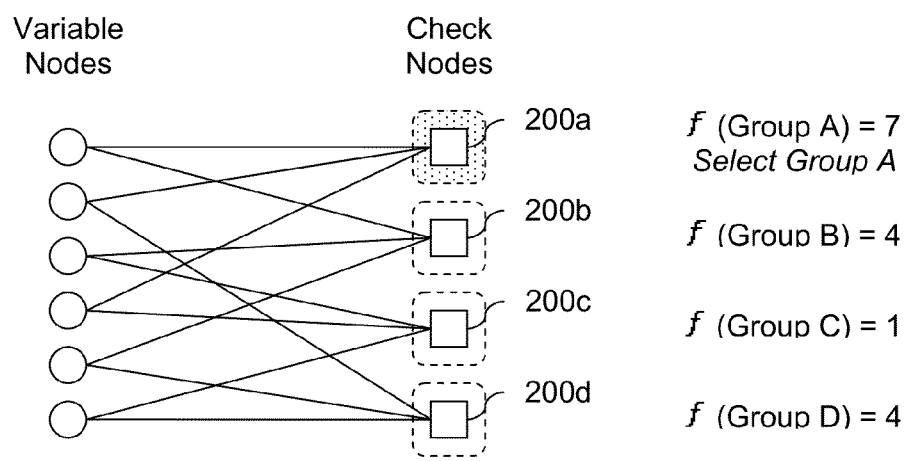
FIG. 2

IMPLEMENTATION OF LDPC SELECTIVE DECODING SCHEDULING

CROSS REFERENCE TO OTHER APPLICATIONS

This application claims priority to U.S. Provisional Patent Application No. 61/342,141 entitled IMPLEMENTATION OF LDPC SELECTIVE DECODING SCHEDULING filed Apr. 9, 2010 which is incorporated herein by reference for all purposes.

BACKGROUND OF THE INVENTION

Low-density parity-check (LDPC) codes are a type of error correcting code. LDPC codes are becoming increasingly popular for encoding data that is written to storage media, such as hard disk drives or flash drives.

When compared to other message-passing scheduling methods, e.g., flooding scheduling, LDPC layered decoding has better convergence speed in terms of the number of iterations and better decoding performance. Therefore, it would be desirable to develop techniques for LDPC layered decoding.

BRIEF DESCRIPTION OF THE DRAWINGS

Various embodiments of the invention are disclosed in the following detailed description and the accompanying drawings.

FIG. 2 is a diagram showing some embodiments of groups of check nodes.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
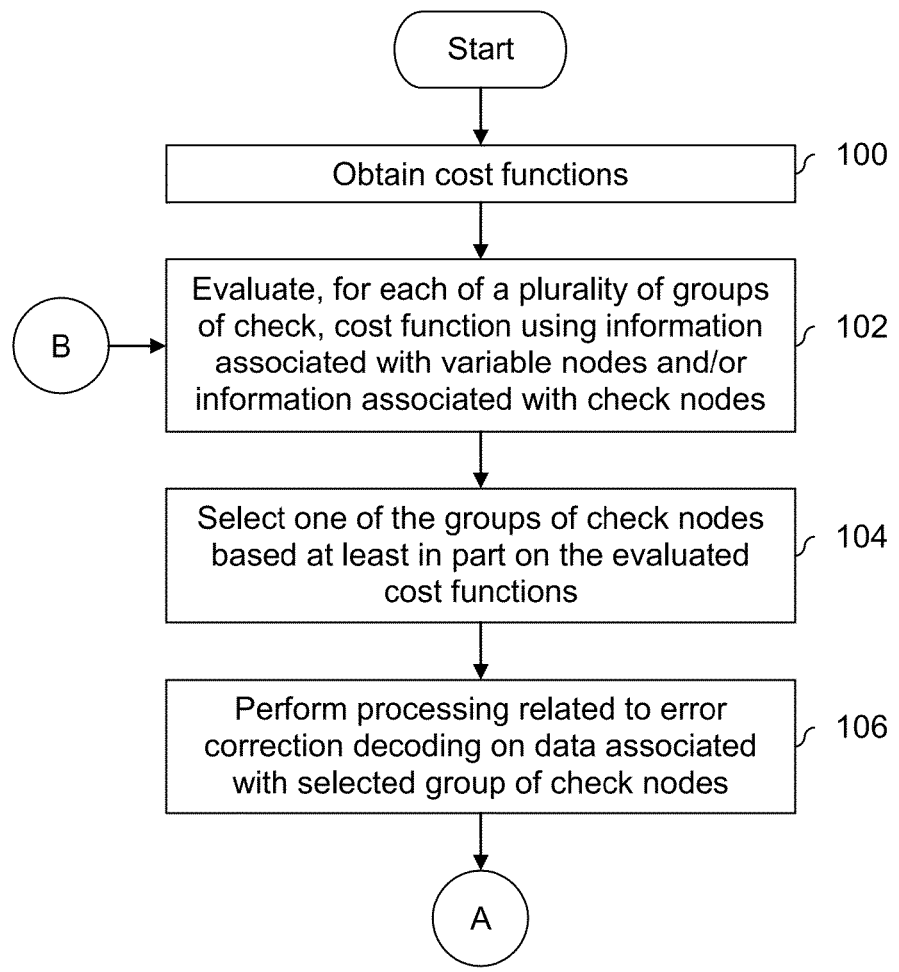
FIG. 1 is a flowchart illustrating an embodiment of a process for decoding data.

FIG. 1 is a flowchart illustrating an embodiment of a process for decoding data. In the example shown, distorted LDPC (low-density parity-check) encoded data is decoded. LDPC codes are a class of error correction codes. An LDPC code is defined as the null space of a sparse parity-check matrix H. An LDPC codeword $L=(l_0, l_1, \ldots, l_{n-1})$ is a vector in the null space which can satisfy all the check nodes of H. An LDPC code can achieve relatively good error performance by using a message passing algorithm (such as SPA (sum-product algorithm), min-sum, etc.).

The parity-check matrix H of an LDPC code is related to a bipartite graph, also referred to as a Tanner Graph. Given an m×n parity-check matrix H of an LDPC code, the nodes of the Tanner Graph G are divided into two sets of nodes, V and C. V contains n variable nodes $v_j$ (or left nodes), corresponding to the columns of H, and m check nodes $c_i$ (or right nodes), corresponding to the rows of H. A variable node $v_j$ is connected to a check node $c_i$ if and only if the corresponding entry $h_{i,j}$ of the parity-check matrix H is non-zero. The degree of a node in G is defined as the number of edges connected to it. The degree of a variable node is simply equal to the weight of its corresponding column of H, and the degree of a check node is simply equal to the weight of its corresponding row of H.

At 100, a cost function is obtained. In some embodiments, a cost function (*f*) receives as an input information associated with variable nodes, such as the distorted reliability value associated with each variable node and the updated message from the connected check nodes. In some embodiments, *f* is a function of check nodes information, such as the number of unsatisfied check nodes within each group of check nodes. In some embodiments, a cost function is a function of both check nodes and variable nodes information. In some embodiments, a cost function will also include some special constraints (e.g., the same group of check nodes is never processed twice in the same iteration and/or the same group of check nodes is never processed consecutively even in the different iterations.).

A cost function is evaluated for each of a plurality of groups of check nodes using information associated with variable nodes and/or information associated with check nodes at 102. Some examples of specific cost functions are described in further detail below. One of the groups of check nodes is selected based at least in part on the evaluated cost functions at 104. For example, in some embodiments the group minimizing/maximizing the evaluated cost function is selected. If there is more than one group that minimizes the cost function, another cost function can be used to conduct the further selection. If there are still multiple groups remaining after evaluating all the cost functions, one of the groups is chosen arbitrarily in some embodiments.

At 106, processing related to error correction decoding is performed on data associated with the selected group of check nodes. In some embodiments this includes performing a check node update (e.g., by computing—for each check node in the selected group—an outgoing message to each connected variable node $v_j$ based on the incoming messages from all the other connected variable nodes $v_{j'}(j'\neq j)$) and a variable node update (e.g., by computing—for each variable node $v_j$ connected to any check node in the selected group— its outgoing message to each connected check node $c_i$ based on the incoming messages from all the other connected check nodes $c_{i'}(i'\neq i)$).

One benefit to using the technique described herein is that error correction decoding (at least in some cases) is completed in a shorter amount of time than some other techniques. For example, suppose there are m groups of check nodes, each group including a single check node. Compared to an HSS processing technique that always processes the groups of check nodes in the order Group 1, Group 2, . . . , Group m, the technique described herein may finish sooner. For example, if some error or noise remains in Group m (i.e., the last group to be processed by the HSS technique in an iteration) then the technique described herein will likely select and process data associated with Group m before the HSS technique does.

FIG. 2 is a diagram showing some embodiments of groups of check nodes. In the diagrams shown, the example process shown in FIG. 1 is used to select a group of check nodes using a cost function. In the first example shown (diagram 210), there are 6 variable nodes, each variable node of which is connected to 2 (out of 4 total) check nodes. Each of the 4 check nodes is in turn connected to 3 of the 6 total variable nodes. The connections control the propagation of information during error correction decoding of the distorted LDPC encoded data.

In diagram 210, the first group of check nodes (Group 1) includes 3 check nodes: 200*a*-200*c*. The second group of check nodes (Group 2) includes a single check node: 200*d*. For each group, a cost function is evaluated. For Group 1, the evaluated cost function has a value of 3. For Group 2, the evaluated cost function has a value of 5. In this example, the group with the lowest evaluated cost function is selected (that is, Group 1), and error correction processing is performed on equations or functions associated with the selected group (i.e., Group 1 in this example).

Diagram 220 shows the same variable nodes, check nodes, and connections as in diagram 210 with different groups of check nodes. In diagram 220, there are four groups, and each group includes a single check node. That is, Group A includes check node 200*a*, Group B includes check node 200*b*, Group C includes check node 200*c*, and Group D includes check node 200*d*.

For each of the 4 groups shown, a cost function is evaluated. The values of the evaluated cost function are 7, 4, 1, and 4, respectively. In this example, the group with the highest evaluated cost function is selected, and error correction decoding is performed on function(s)/equation (s) associated with Group A.

Using the selected groups shown in diagram 210, a more detailed example of check node updating (used in some embodiments at 106 in FIG. 1) is shown below. In diagram 210, the selected group includes check nodes 200*a*-200*c*. During check node updating, for each check node in the selected group, an outgoing message is determined to each connected variable node based on the incoming messages from all other connected variable nodes. Note that check node 200*d* is not included in the table below because it is not in the selected group.

TABLE 1

Check node update using diagram 210 as an example

|  | From check node 200a | From check node 200b | From check node 200c |
|---|---|---|---|
| To variable node 201a | Based on IN MSG from variable nodes 201b and 201d | Based on IN MSG from variable nodes 201c and 201e | None |
| To variable node 201b | Based on IN MSG from variable nodes 201a and 201d | None | None |
| To variable node 201c | None | Based on IN MSG from variable nodes 201a and 201e | Based on IN MSG from variable nodes 201d and 201f |
| To variable node 201d | Based on IN MSG from variable nodes 201a and 201b | None | Based on IN MSG from variable nodes 201c and 201f |
| To variable node 201e | None | Based on IN MSG from variable nodes 201a and 201c | None |

TABLE 1-continued

Check node update using diagram 210 as an example

|  | From check node 200a | From check node 200b | From check node 200c |
|---|---|---|---|
| To variable node 201f | None | None | Based on IN MSG from variable nodes 201c and 201d |

Using the selected groups shown in diagram 210, a more detailed example of variable node updating (used in some embodiments at 106 in FIG. 1) is shown below. In some embodiments, check node updating is performed first, and then variable node updating is performed. During variable node updating, for each variable node connected to a check node in the selected group (in this example, all of the variable nodes are connected to a check node in the selected group), an outgoing message is determined to be sent to a connected check node based on the incoming messages from all other connected check nodes.

TABLE 2

Variable node update using diagram 210 as an example

|  | To check node 200a | To check node 200b | To check node 200c | To check node 200d |
|---|---|---|---|---|
| From variable node 201a | Based on IN MSG from check node 200b | Based on IN MSG from check node 200a | None | None |
| From variable node 201b | Based on IN MSG from check node 200d | None | None | Based on IN MSG from check node 200a |
| From variable node 201c | None | Based on IN MSG from check node 200c | Based on IN MSG from check node 200b | None |
| From variable node 201d | Based on IN MSG from check node 200c | None | Based on IN MSG from check node 200a | None |
| From variable node 201e | None | Based on IN MSG from check node 200d | None | Based on IN MSG from check node 200b |
| From variable node 201f | None | None | Based on IN MSG from check node 200d | Based on IN MSG from check node 200c |

As shown in the above example, a group of check nodes can include one or more check nodes. In some embodiments, each group has the same number of check nodes (see, e.g., diagram 220); in other embodiments, the groups have different numbers of check nodes in them (see, e.g., diagram 210).

Figure 3:
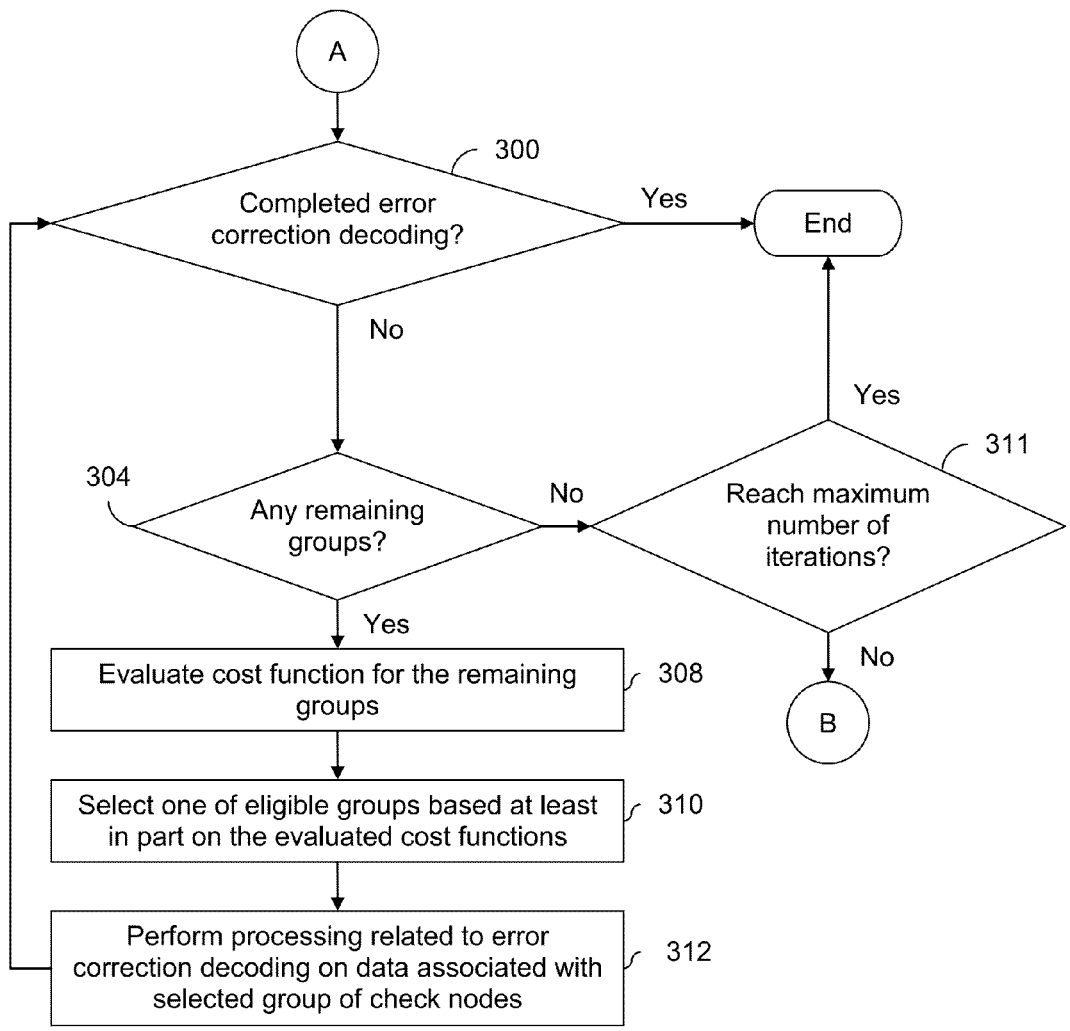
FIG. 3 is a flowchart illustrating an embodiment of a process for subsequent processing of distorted LDPC encoded data.

FIG. 3 is a flowchart illustrating an embodiment of a process for subsequent processing of distorted LDPC encoded data. In the example shown, the process shown in FIG. 1 continues. Some of the processing shown in this figure is/are similar to processing shown in FIG. 1. For example, both steps 102 and 308 evaluate a cost function, steps 104 and 310 select a group of check nodes based on an evaluated cost function, and steps 106 and 312 perform processing related to error correction decoding. In some embodiments, a (e.g., single) hardware component or other processor is used to perform similar steps in FIGS. 1 and 3.

At 300, it is determined if error correction decoding is completed. In some embodiments, this includes checking if all the parity checks are satisfied. In one example this includes computing the hard decision $\hat{l}_j$ for each variable node $v_j$ based on the channel information and the incoming messages from all the connected check nodes $c_i$. If the decisions $\hat{L}=(\hat{l}_0, \hat{l}_1, \ldots, \hat{l}_{n-1})$ satisfy all the check nodes, then error correction decoding is successful and the decoded data is output. In some embodiments, decoding ends if a (e.g., predefined) maximum number of iterations is reached. As used herein, an iteration includes (for x groups of check nodes) x selections. So, if there are x groups, there are x selections in a complete or full iteration. For example, in diagram 210 in FIG. 2, a full or complete iteration includes 2 selections (one for Group 1 and one for Group 2), and in diagram 220 a complete or full iteration includes 4 instances of selecting/processing (one each for Groups A-D).

It is determined at 304 if there are any remaining groups. For example, in diagram 210 in FIG. 2 if both Group 1 and Group 2 have been selected and processed then there are no remaining groups, at least during this iteration. If there are no remaining groups, the process will end the decoding if the pre-determined maximum number of iteration is reached at 311. If not, the process will evaluate cost functions at 102 in FIG. 1 (e.g., for all groups since a new iteration is starting). Otherwise (i.e., if there is at least one group remaining during a current iteration) a cost function is evaluated for the remaining groups at 308. In some embodiments, if there is only one group of check nodes remaining during an iteration, step 308 is skipped and the single remaining group is selected without evaluating a cost function. At 310, one of the remaining groups is selected based at least in part on the evaluated cost functions. Processing related to error correction decoding is performed on data associated with selected group of check nodes at 312.

The following figure applies the example processes described in FIGS. 1 and 3 to exemplary data.

Figure 4:
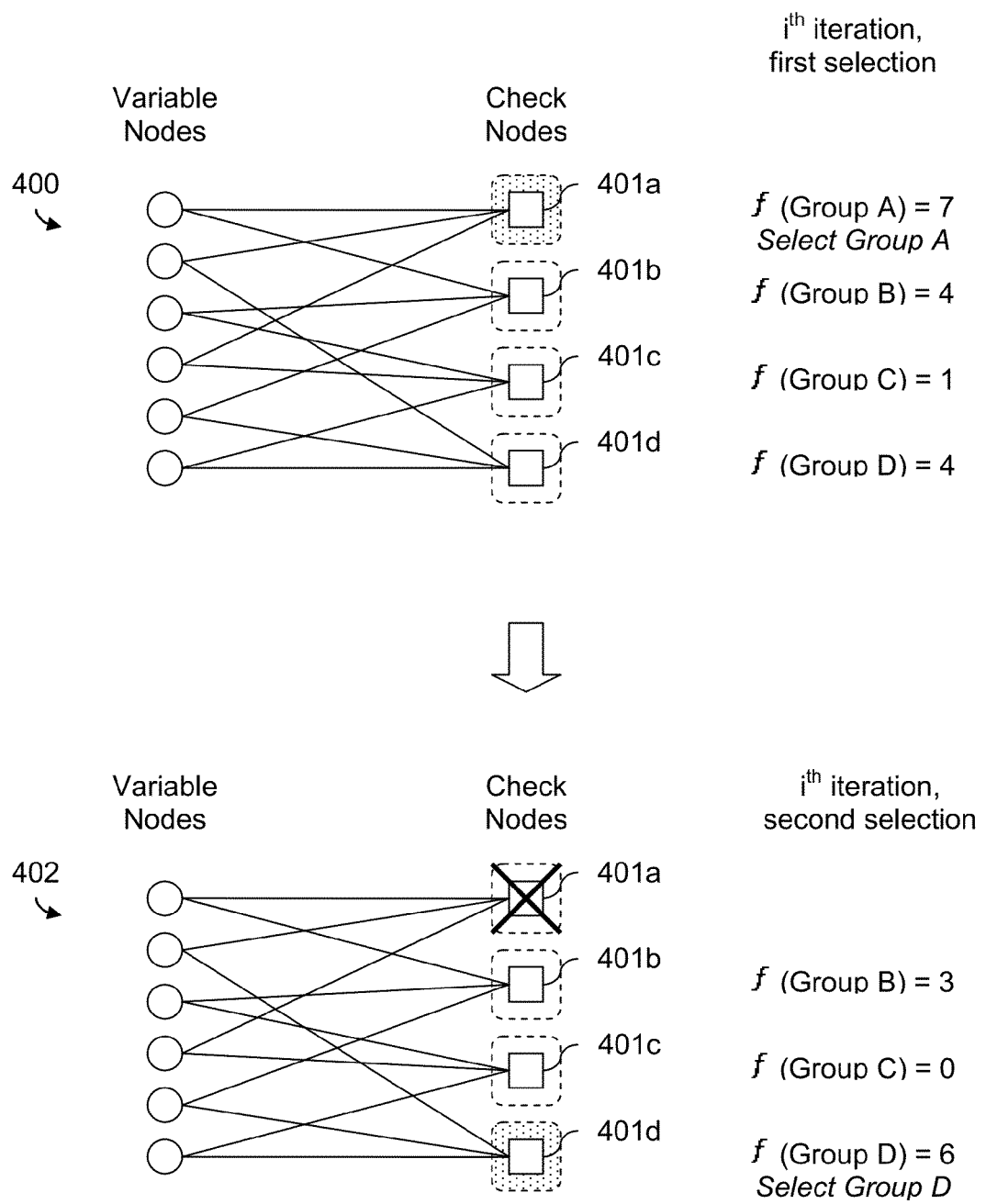
FIGS. 4 and 5 show an embodiment of a group of check nodes that are processed in a selective order based on a cost function.
Figure 5:
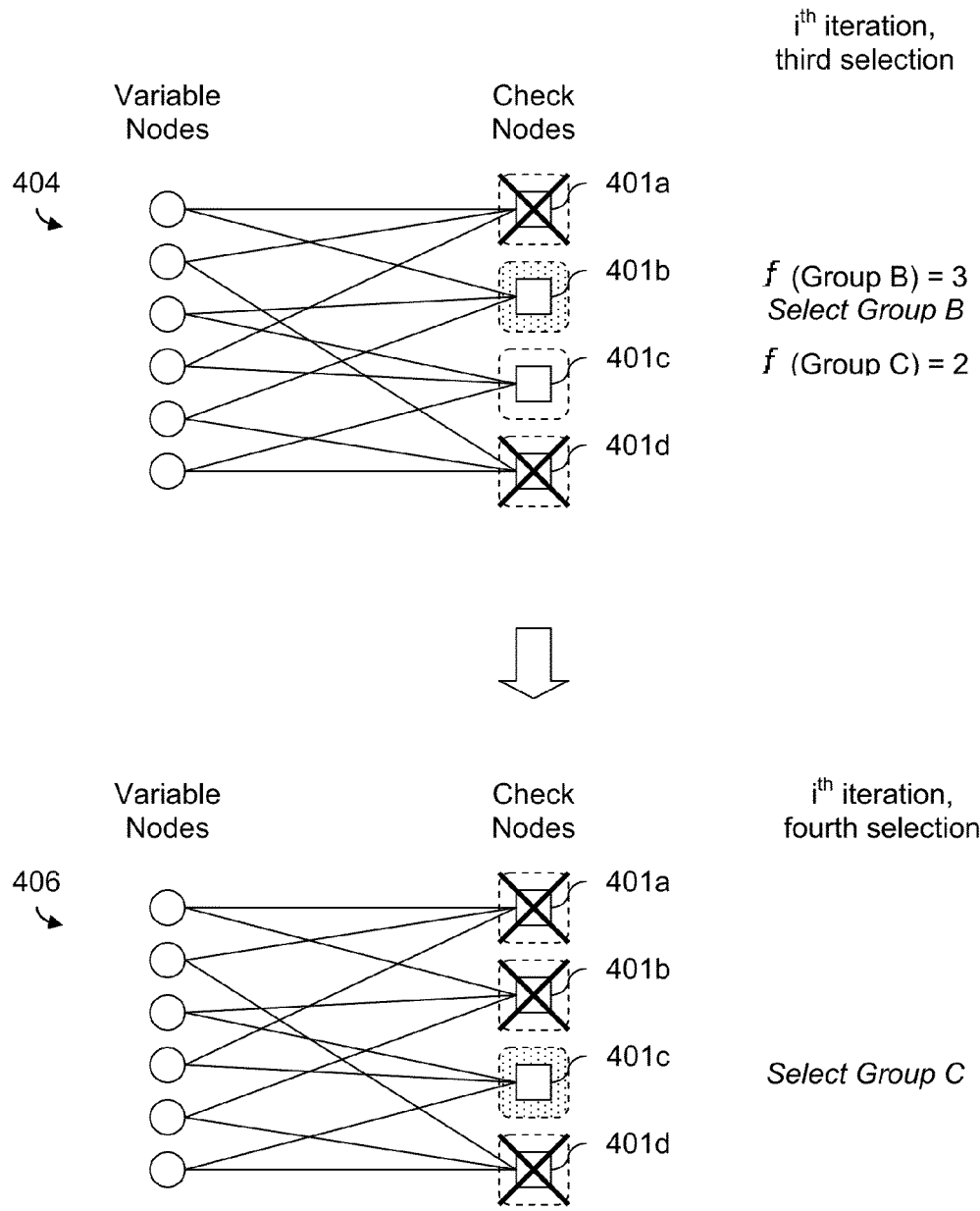

FIGS. 4 and 5 show an embodiment of a group of check nodes that are processed in a selective order based on a cost function. In diagram 400, the example process of FIG. 1 is used to select group of check nodes 401a based on the evaluation of a cost function for groups 401a-401d. In this example, the evaluated cost functions for Groups A-D are (respectively) 7, 4, 1, and 4, and (at least in this example) the group with the highest evaluated cost function is selected (i.e., Group A).

After selecting group 401a in diagram 400 and performing processing on data associated with that group, error correction processing is not completed (e.g., because one or more parity checks are not satisfied). See, for example, step 300 in FIG. 3. A next group is then selected in diagram 402. Since a group of check nodes can only be selected at most once during a given iteration, group 401a is not eligible to be selected at the point in time shown in diagram 402. In some embodiments, a cost function is not evaluated for non-eligible groups since they are not eligible to be selected.

The cost function is evaluated for a second time, and at least in this example the evaluated cost functions for each group are different in diagrams 400 and 402. In diagram 402, the evaluated cost functions for Groups B-D are 3, 0, and 6, respectively. Group D is selected since it has the highest evaluated cost function.

Error correction processing is not done (e.g., one or more parity checks are still not satisfied), and in diagram 404 the cost function is evaluated again in FIG. 5. Group B is selected because it has a higher evaluated cost function (3) compared to Group C (2). In diagram 406, only Group C remains since all other groups (i.e., Groups A, B, and D) have been selected. In some embodiments, the cost function is not evaluated when only one group of check nodes remains or is otherwise eligible.

Figure 6A:
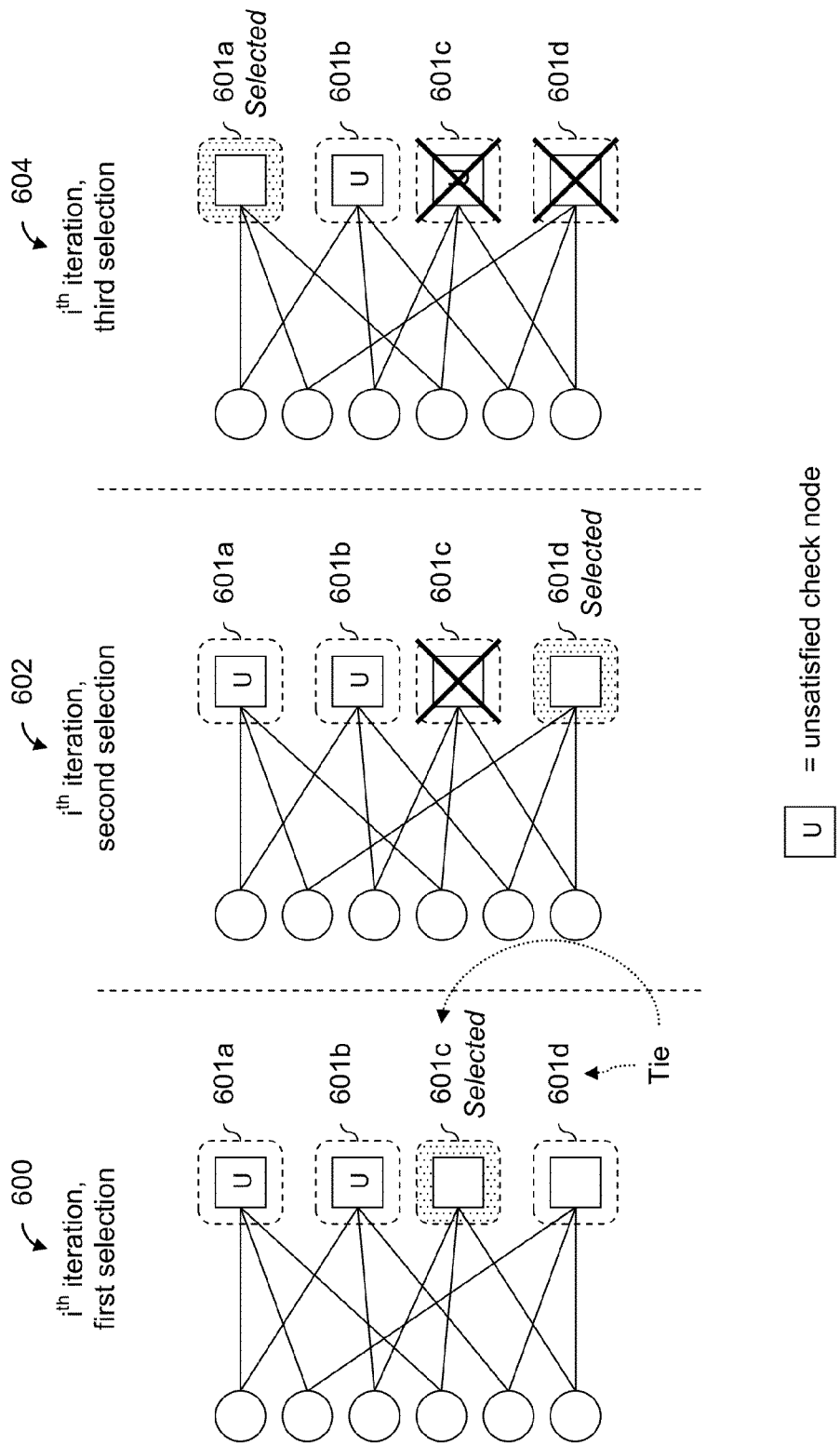
FIGS. 6A and 6B show an embodiment that uses a cost function that takes as input information associated with a check node.
Figure 6B:
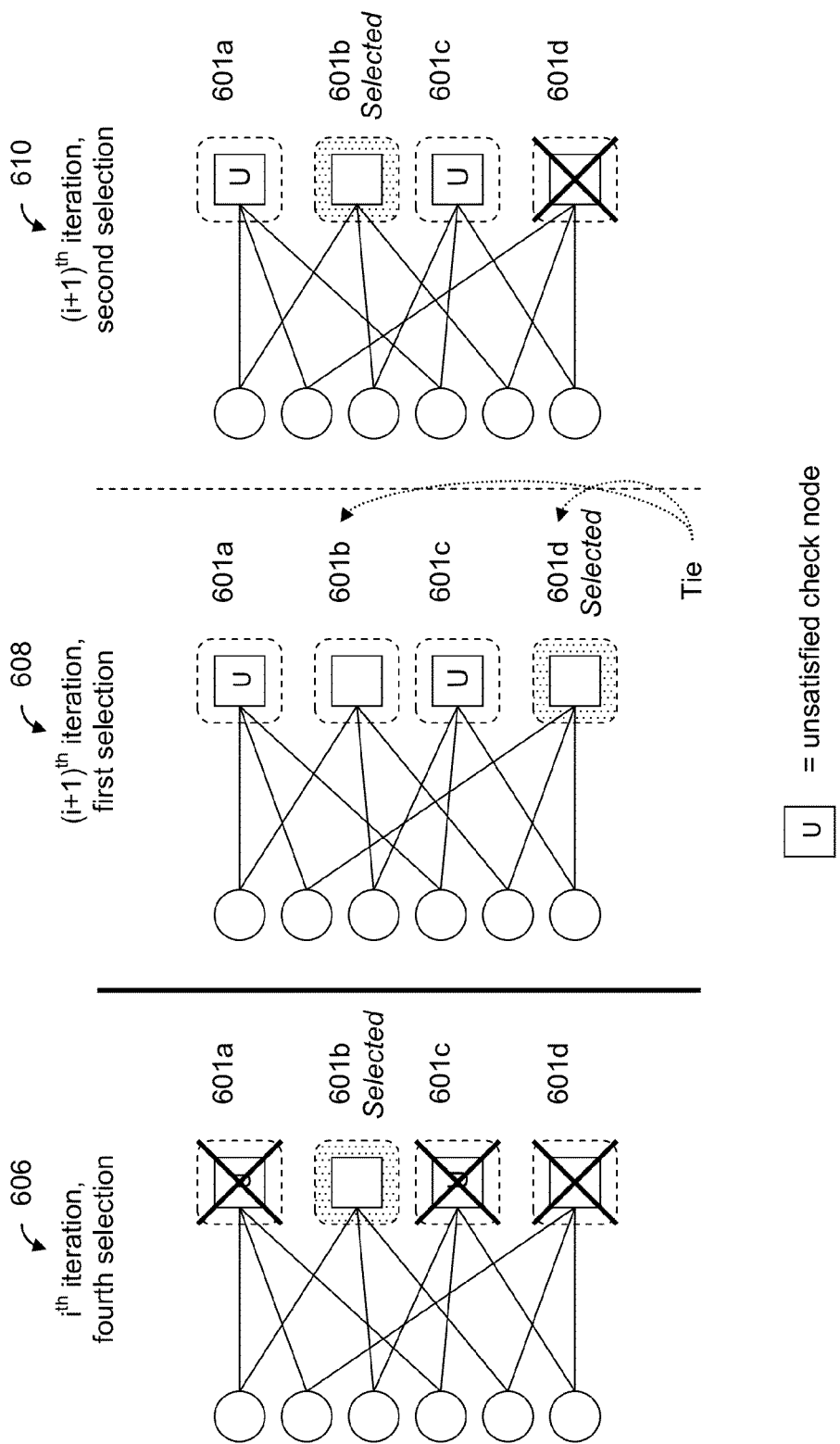

FIGS. 6A and 6B show an embodiment that uses a cost function that takes as input information associated with a check node. In the example shown, the group of check nodes with the least number of unsatisfied check nodes is selected. In some embodiments, this technique is used in applications or environments where there is a relatively low signal-to-noise ratio (SNR).

Diagram 600 shows a first selection of the $i^{th}$ iteration. In this example, unsatisfied check nodes (e.g., a parity check associated with that check node is not passing) are indicated with a "U". Groups 601c and 601d have the least number of unsatisfied check nodes (i.e., 0 unsatisfied check nodes), and there is a tie between them. Group 601c is selected in this example. The second selection of the iteration (e.g., after processing of data associated with selected group 601c is completed) is shown in diagram 602. In diagram 602, group 601d has the least number of unsatisfied check nodes and is selected.

The third selection of the $i^{th}$ iteration is shown in diagram 604. During that selection, groups 601a and 601b have not been selected yet in the $i^{th}$ iteration, and group 601a is selected since the check node in group 601b is an unsatisfied check node.

FIG. 6B includes diagram 606 which shows the fourth selection of the $i^{th}$ iteration. Group 601b is the only group remaining and is selected. A new iteration starts in diagram 608. In diagram 608, groups 601b and 601d are tied (based strictly on number of unsatisfied check nodes) since both have the least number of unsatisfied check nodes. So group 601d is selected arbitrarily, at least in this example. In some embodiments, group 601d is the only eligible selection because of the constraint (e.g., in the cost function) that no consecutive processing is performed on the same group of check nodes. In the second selection of the $(i+1)^{th}$ iteration shown diagram 610, groups 601a-601c have not been selected yet in the $(i+1)^{th}$ iteration, and group 601b is selected because it has the least number of unsatisfied check nodes.

Figure 7:
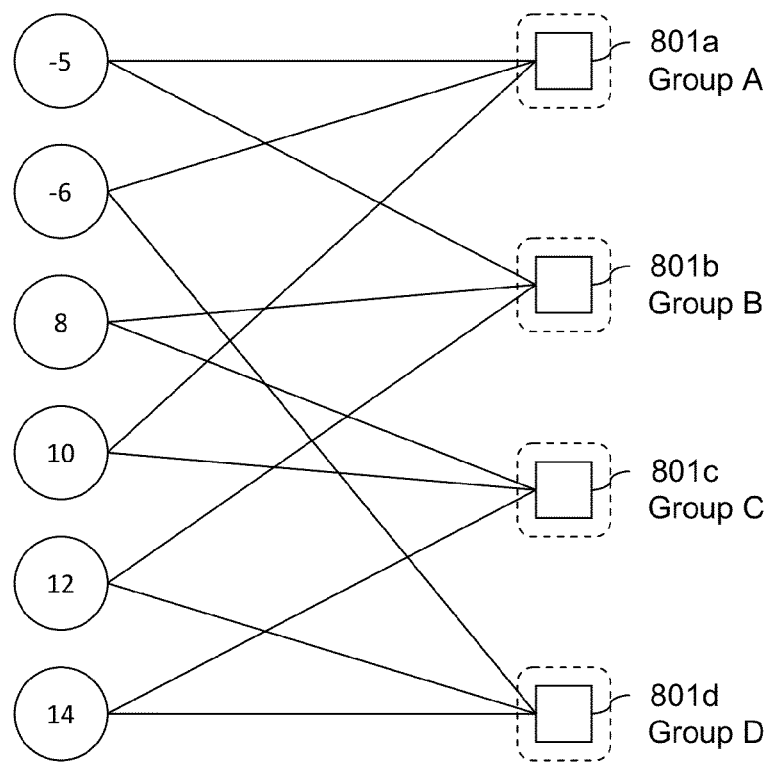
FIG. 7 is a diagram showing an embodiment of reliability values associated with variable nodes.

FIG. 7 is a diagram showing an embodiment of reliability values associated with variable nodes. In some embodiments, information associated with a variable node (such as a reliability value) is used to evaluate a cost function used to select a group of check nodes. Some examples are described in further detail below. In the examples described below, a reliability value can be a positive value or a negative value, and the example processes below use the absolute value (e.g., magnitude or amplitude) of the reliability values.

In a first example, an average of the reliability values is determined first for all groups, and then the group with the largest average is selected. Using the reliability values shown in FIG. 7, an example of this is shown below. In this example, there is a tie between Group C (801c) and Group D (801d). In this example (and in other embodiments) any tie-breaker can be employed including (for example) randomly selecting one of the groups, selecting a default group (e.g., first/last group), selecting the group that has gone the longest since it was last selected, etc.

TABLE 3

An example of selecting a group with the largest average reliability

| | Reliability values for associated variable nodes (absolute value) | Average of reliability values |
|---|---|---|
| Group A | 5, 6, and 10 | 7 |
| Group B | 5, 8, and 12 | 8⅓ |
| Group C | 8, 10, and 14 | 10⅔ (Tie for largest average; pick Group C or Group D) |
| Group D | 6, 12, and 14 | 10⅔ (Tie for largest average; pick Group C or Group D) |

In a second example, the group with the least number of reliability values below a (e.g., preset) threshold is selected. The table below shows an example using the data shown in FIG. 7 and a threshold of 7. Group C (801c) is selected using this technique and with the example reliability values.

TABLE 4

An example of selecting a group with the least number of reliabilities below a threshold

| | Reliability values for associated variable nodes (absolute value) | Number of reliabilities below threshold of 7 |
|---|---|---|
| Group A | 5, 6, and 10 | 2 |
| Group B | 5, 8, and 12 | 1 |
| Group C | 8, 10, and 14 | 0 (Least number of reliabilities below 7; pick Group C) |
| Group D | 6, 12, and 14 | 1 |

In a third example, the group with the largest of the smallest reliabilities is selected. That is, first, the smallest reliability value for each group is selected and then the group with largest of those values is selected. The table below shows an example using the reliability values from FIG. 7. Group C (801c) is selected using this technique and with the example reliability values.

TABLE 5

An example of selecting a group with the largest of smallest reliability values

| | Reliability values for associated variable nodes (absolute value) | Smallest of reliability values |
|---|---|---|
| Group A | 5, 6, and 10 | 5 |
| Group B | 5, 8, and 12 | 5 |
| Group C | 8, 10, and 14 | 8 (Largest of smallest values; select Group C) |
| Group D | 6, 12, and 14 | 6 |

In some embodiments, the three techniques shown above in Tables 3-5 are used in applications or cases where a SNR is relatively low. In some such low SNR environments, many small errors exist, and the techniques described above are directed towards spreading more reliable data or information earlier than "bad" data or information.

In various embodiments, the examples above can be modified. For example, in a modification of the first example, the group with the smallest average reliability values is selected. In another example, the group having the most number of variable nodes with a reliability value below a present threshold is selected. In yet another example, for each group the smallest reliability value is selected, then the group having the smallest of those reliability values is selected (i.e., smallest of smallest reliability values). In another example, the group having the most number of unsatisfied check nodes is selected. In some embodiments, the examples described above are used when SNR is relatively high such that only a very small number of errors exist. Therefore, there is a higher chance to select a group of check nodes which the error variable nodes are associated with and can be corrected.

Figure 8:
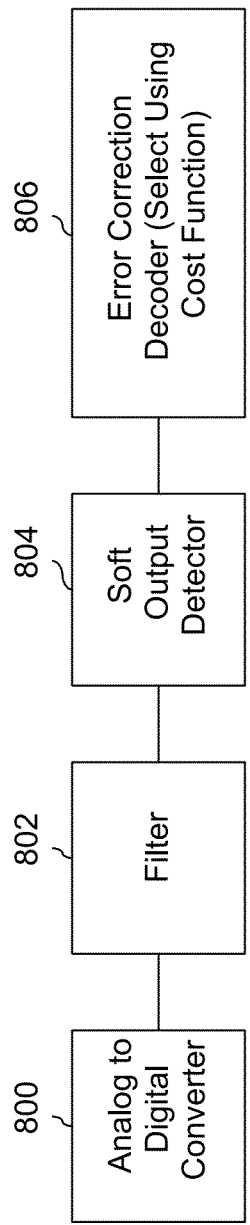
FIG. 8 is a diagram showing an embodiment of a disk drive system that includes an error correction decoder configured to use a cost function to select a group of check nodes.

FIG. 8 is a diagram showing an embodiment of a disk drive system that includes an error correction decoder configured to use a cost function to select a group of check nodes. For clarity, some components may not necessarily be shown. In the example shown, encoded data (e.g., encoded using an LDPC code) is stored on one or more disks (not shown). Analog data is passed to analog to digital converter (ADC) 800, and digital data is passed from ADC 800 to filter 802. The filtered data is passed to soft output detector 804 which in turn is coupled to error correction decoder 806. Error correction decoder 806 is configured to select a group of check nodes based on a cost function and process data associated with the selected group.

In this figure, a storage application is shown. In some other embodiments, an error correction decoder configured to select a group of check nodes using a cost function is included in some other system or is used in some other application or environment besides storage.

Figure 9:
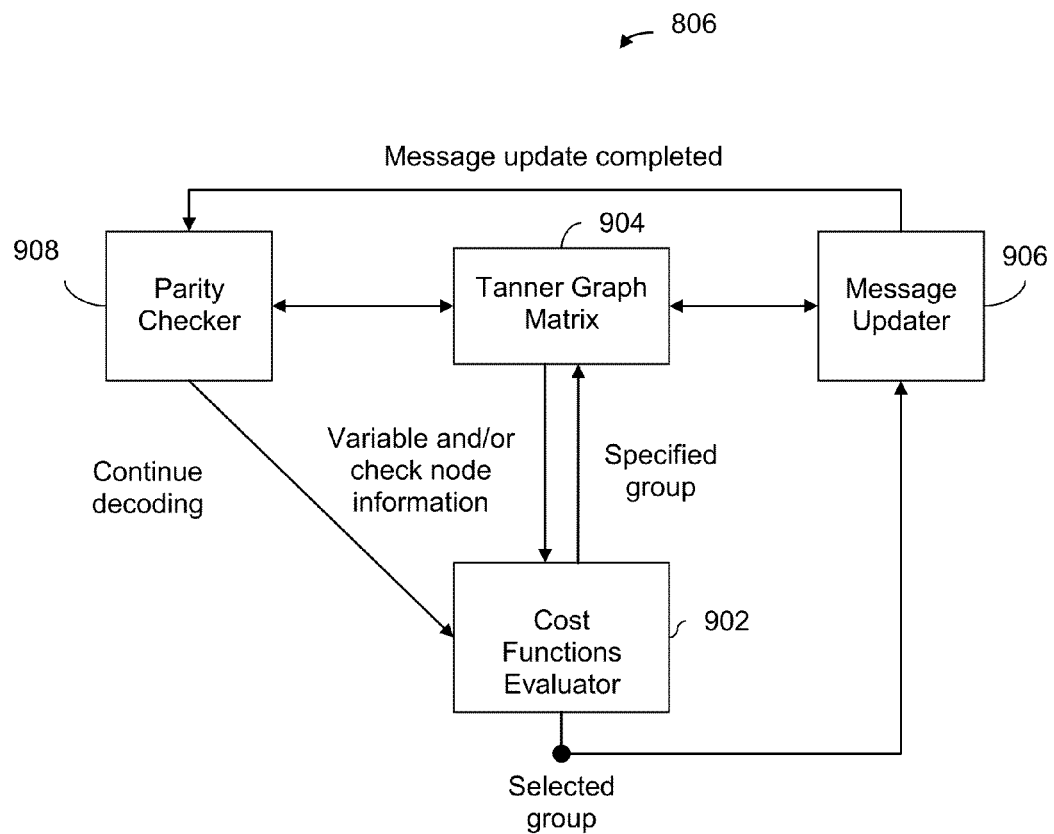
FIG. 9 is a diagram showing an embodiment of a system configured to select a group of check nodes based on a cost function.

FIG. 9 is a diagram showing an embodiment of a system configured to select a group of check nodes based on a cost function. In some embodiments, error correction decoder 806 from FIG. 8 includes the system shown. In various embodiments, the system shown in this figure is configured using any appropriate components. For example, in some embodiments a general purpose processor is configured to perform the functions described herein.

In the example shown, cost function evaluator 902 obtains the pertinent variable and/or check node information from Tanner Graph matrix 904; this information is used to evaluate a cost function. In this particular example, cost function evaluator 902 specifies a group to Tanner Graph matrix 904, and related variable node and/or check node information is passed from Tanner Graph matrix 904. Tanner Graph matrix 904 stores the connections between variable nodes and check nodes; the particular connections will depend upon the particular LDPC code used. Tanner Graph matrix 904 also stores information related to the variable nodes and check nodes, for example, related to which check nodes are unsatisfied (e.g., based on a parity check) and/or reliability values associated with the variable nodes.

In various embodiments, various cost functions are used, and the particular information obtained will vary depending upon the particular cost function. In some embodiments, cost function evaluator 902 is configurable. For example, it may include an interface configured to receive or otherwise obtain a cost function. In some embodiments, the particular information obtained from Tanner Graph matrix 904 will vary depending upon the particular cost function programmed into or otherwise provided to cost function evaluator 902.

After evaluating the cost function for all the groups (if appropriate), one of the groups is selected and is output by cost function evaluator 902 as the selected group. In some embodiments, cost function evaluator 902 is configured to not evaluate the cost function if there is only a single remaining group. For example, if there is one group and it is the first selection of an iteration, that group is selected without evaluating the cost function. That is, flooding schedule is a special case.

The selected group is passed from cost function evaluator 902 to message updater 906. Message updater 906 performs processing related to error correction decoding on data associated with the selected group. For example, message updater 906 may perform check node updates and/or variable node updates on data stored in Tanner Graph matrix 904 related to the selected group.

After updating information stored in Tanner Graph matrix 904, message updater 906 send a "message update completed" signal to parity checker 908. Parity checker 908 determines if error correction decoding is completed by checking if all parity checks are satisfied using information stored in Tanner Graph matrix 904. If error correction is not completed, parity checker 908 sends a "continue decoding" signal to cost functions evaluator 902 and the next group is selected.

Figure 10:
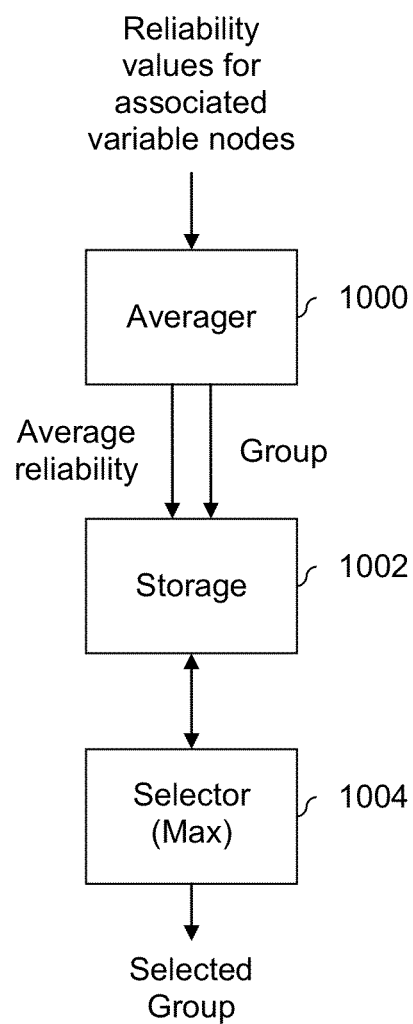
FIG. 10 is a diagram showing an embodiment of a cost function evaluator configured to evaluate a cost function and select a group of check nodes based on the evaluation (s).

FIG. 10 is a diagram showing an embodiment of a cost function evaluator configured to evaluate a cost function and select a group of check nodes based on the evaluation (s). In some embodiments, cost function evaluator 902 in FIG. 9 is implemented as shown. In this particular example, the cost function takes as an input reliability values for associated variable nodes. For other cost functions, functions performed by and/or information input to a corresponding cost function evaluator are different than the example shown.

For each check node in the given group, the reliability values of variable nodes that are connected to that check node are obtained. An average of the reliability values is determined for each check node in the given group by averager 1000. The average along with its corresponding group is passed from averager 1000 to storage 1002 where the information is stored. After averager 1000 determines and stores the average for each check node in the selected group in storage 1002, selector 1004 accesses the stored averages and selects the group with the largest stored average; that group is output as the selected group. In some cases, there is a tie and selector 1004 is configured to perform tie breaking. For example, a random group can be selected from the tied groups, the tied group that has not been selected for the longest period of time, or a default group (e.g., first/last tied group in some order) is selected.

In some embodiments, processing groups of check nodes in a selective order based on a cost function can be applied to LDPC layered decoding. This is referred to herein as selective layered decoding scheduling. In LDPC layered decoding, a parity-check matrix H includes a plurality of horizontal layers. LDPC layered decoding is performed by applying the decoding algorithm layer by layer. When compared to other message-passing scheduling methods, e.g., flooding scheduling, LDPC layered decoding has better convergence speed in terms of the number of iterations and better decoding performance.

In LDPC layered decoding, check node updates and variable node updates are performed layer by layer. As explained above, an LDPC code can be defined by a sparse parity-check matrix H. The variable nodes representing the information bits correspond to the columns of H, and the check nodes implementing the parity-check for the matrix H correspond to the rows of H. During LDPC decoding, messages are passed between the variable nodes and the check nodes. In particular, during a check node update, for each check node in a layer, an outgoing message from the check node to each connected variable node is determined based on the incoming messages to the check node from all other connected variable nodes. During a variable node update, for each variable node connected to a check node in the layer, an outgoing message from the variable node to each connected check node is determined based on the incoming messages to the variable node from all other connected check nodes. Typically, a check node update is performed first, and then a variable node update is performed. In this manner, check node updates and variable node updates are performed, layer by layer, until a termination condition is reached.

For example, with some techniques, during a first layer iteration, a check node update (indicated by a "C" in the following table) is performed on the $i^{th}$ layer and a variable node update (indicated by a "V" in the following table) is performed on the $(i-1)^{th}$ layer as shown in the table below. During the next layer iteration (i.e., the $2^{nd}$ layer iteration), a check node update is performed on the $(i+1)^{th}$ layer and a variable node update is performed on the $i^{th}$ layer. Note that a check node update is first performed on a particular layer, and then a variable node update is performed on the same layer during the next layer iteration.

| | Layer Iterations | | |
|---|---|---|---|
| | $1^{st}$ | $2^{nd}$ | $3^{rd}$ |
| $(i-1)^{th}$ layer | V | | |
| $i^{th}$ layer | C | V | |
| $(i+1)^{th}$ layer | | C | V |

In selective layered decoding scheduling, check node layers are partitioned into a plurality of groups. Referring to the table below, since the group (and thus the layer) to be processed next may not be selected in a sequential order but selected based on a cost function, during the $2^{nd}$ layer iteration, a check node update may be performed on a layer other than the $(i+1)^{th}$ layer, for example, the $(k)^{th}$ layer. However, a variable node update is still performed on the $i^{th}$ layer during the $2^{nd}$ layer iteration. This is because a check node update has been performed on the $i^{th}$ layer during the $1^{st}$ layer iteration, and a variable node update is performed to continue with the processing of the $i^{th}$ layer during the $2^{nd}$ layer iteration. During the $3^{rd}$ layer iteration, a check node update is performed on the $(j)^{th}$ layer and a variable node update is performed on the $(k)^{th}$ layer, and so on.

| | Layer Iterations | | |
|---|---|---|---|
| | $1^{st}$ | $2^{nd}$ | $3^{rd}$ |
| $(i-1)^{th}$ layer | V | | |
| $i^{th}$ layer | C | V | |
| ... | | | |
| $(j)^{th}$ layer | | | C |
| $(k)^{th}$ layer | | C | V |

Figure 11:
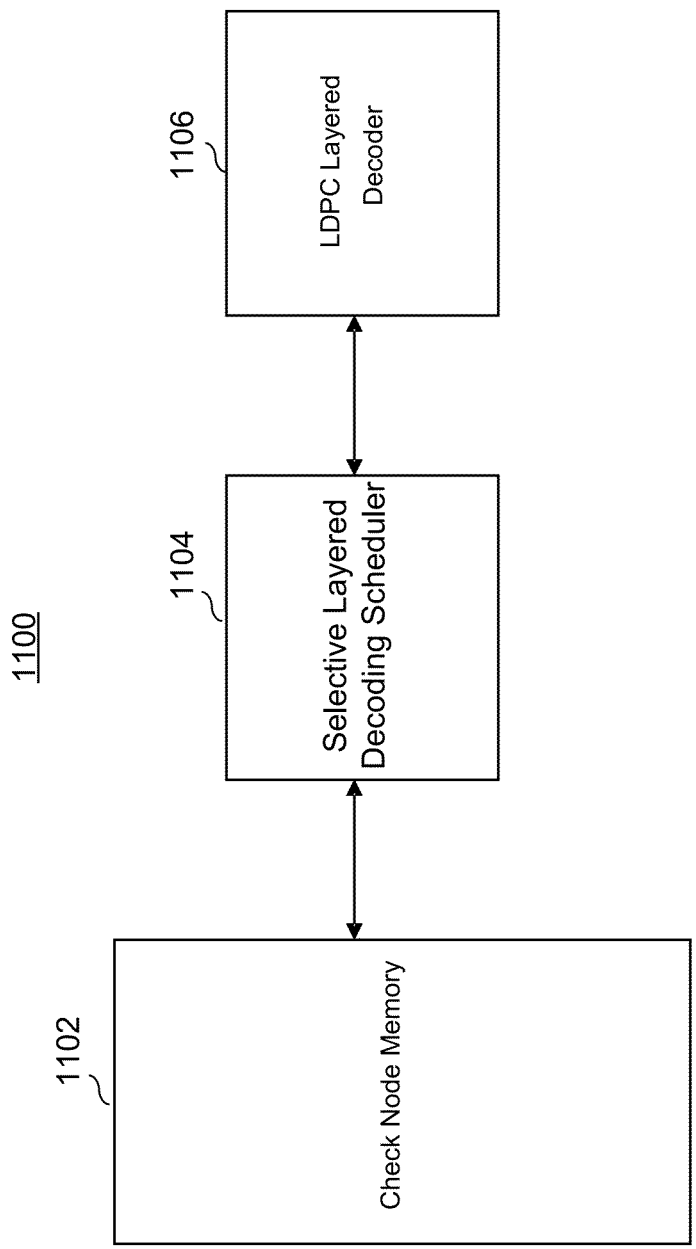
FIG. 11 is a diagram showing an embodiment of a system 1100 that includes a check node memory block 1102, a selective layered decoding scheduler 1104, and an LDPC layered decoder 1106 for processing groups of check nodes in a selective order based on a cost function.

FIG. 11 is a diagram showing an embodiment of a system 1100 that includes a check node memory block 1102, a selective layered decoding scheduler 1104, and an LDPC layered decoder 1106 for processing groups of check nodes in a selective order based on a cost function. Check node memory block 1102 stores the results of check node updates (e.g., messages sent from a check node to a variable node) for different check node layers. Selective layered decoding scheduler 1104 obtains one or more cost functions, evaluates the cost function(s), selects a group to be decoded next, and sends the selected group to LDPC layered decoder 1106 to be decoded. LDPC layered decoder 1106 implements LDPC layered decoding. System 1100 may be used for selective layered decoding and switching check node updates from one layer to another as will be described in greater detail below.

Check node memory block 1102 stores the results of check node updates for different check node layers. For example, the results include messages sent from a check node to a variable node during a check node update. Check node memory block 1102 is partitioned into a plurality of groups of layers such that selective layered decoding scheduler 1104 may select which group to send to LDPC layered decoder 1106 for decoding.

Figure 12:
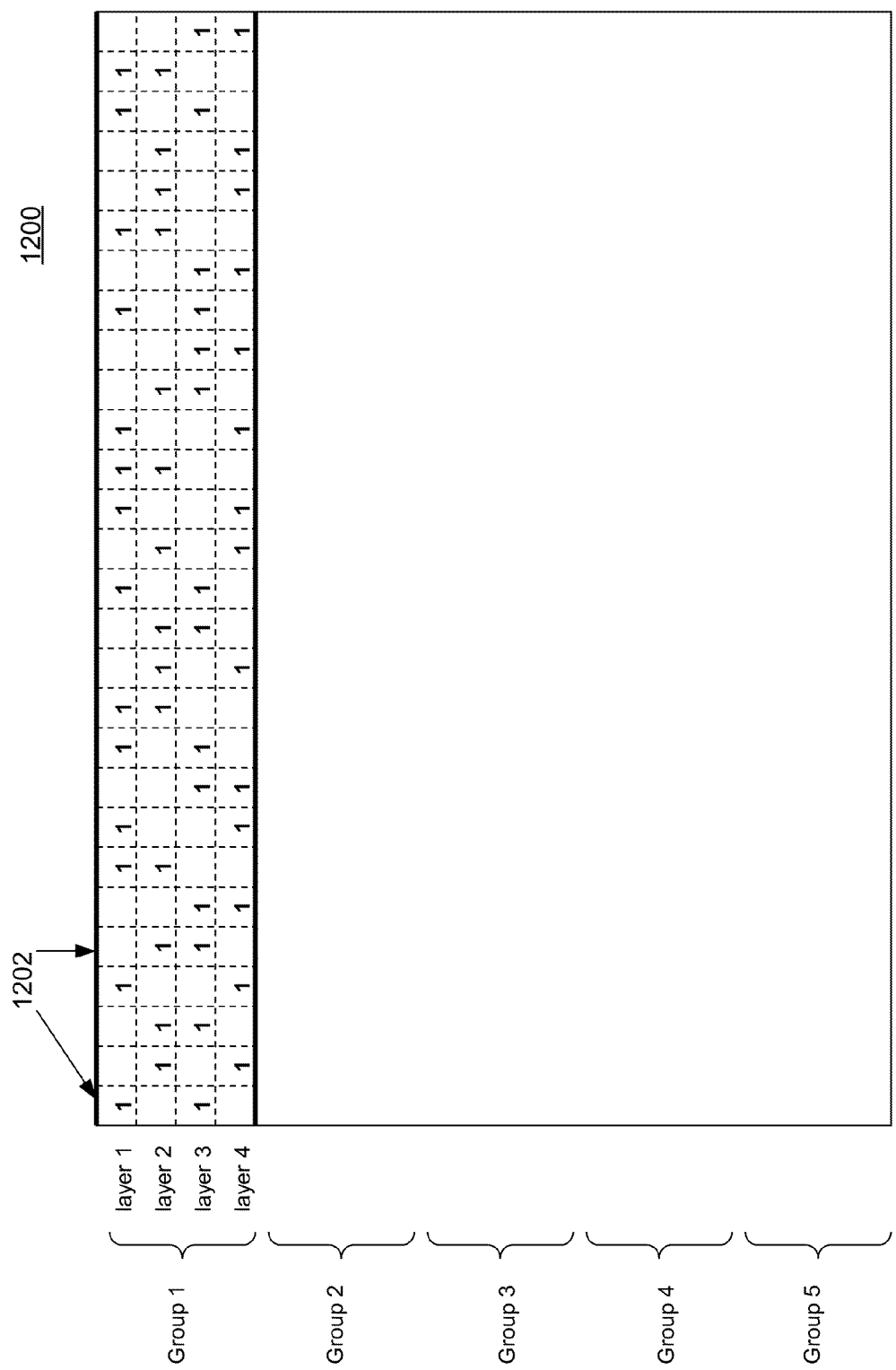
FIG. 12 is a diagram showing an embodiment of an LDPC matrix 1200 partitioned into a plurality of groups of check node layers.

FIG. 12 is a diagram showing an embodiment of an LDPC matrix 1200 partitioned into a plurality of groups of check node layers. As shown in FIG. 12, LDPC matrix 1200 includes five groups, each group has four layers, and thus LDPC matrix 1200 has a total of twenty check node layers.

For example, LDPC matrix 1200 in FIG. 12 may be a parity-check matrix H for a quasi-cyclic LDPC code (QC-LDPC code). Each square 1202 is a circulant matrix, which is a square matrix. For example, an empty square 1202 is a zero matrix, and a square 1202 denoted by "1" is a square matrix with a column weight of one as shown below:

$$\begin{bmatrix} 0 & 0 & 1 \\ 1 & 0 & 0 \\ 0 & 1 & 0 \end{bmatrix}$$

The column weight is one in the above example because each column of the circulant matrix has only a single coefficient with a value of one. Parity-check matrix H may be viewed as containing "columns" of circulant matrices, each such "column" referred to as a circulant matrix column. In FIG. 12, Group 1 has two circulant matrices with column weights of one in each circulant matrix column. Hence, Group 1 has a column weight of two for each of its corresponding circulant matrix columns. Accordingly, Group 1 has a group column weight of two. Groups 2 through 5 also have column weights equal to two for their respective circulant matrix columns, and thus LDPC matrix 1200 has an overall column weight of ten for its circulant matrix columns. The size of the square matrix shown above is a 3 by 3 matrix; however, other square matrices of different sizes may be used as well.

Partitioning LDPC matrix 1200 into a plurality of groups, each group having many zero matrices and a low group column weight (e.g., one or two), has a number of advantages. For example, when the group column weight for each group is only one, then only one non-zero layer (active layer) within each group needs to be processed at a time. Therefore, selective layered decoding scheduler 1104 may select the only non-zero layer within each group and send the non-zero layer to LDPC layered decoder 1106 for decoding at a time. In some embodiments, a multiplexer (MUX) structure may be used, which simplifies the overall hardware design and reduces the amount of hardware required for system 1100. The design of LDPC layered decoder 1106 is also simplified because the decoder only needs to process a single layer at a time.

In some embodiments, an LDPC matrix may be constructed in such a way that the group number is reduced. With fewer groups, the decoding latency can be reduced, thus improving the decoding performance of the system.

Referring back to FIG. 11, selective layered decoding scheduler 1104 is coupled with check node memory block 1102 and LDPC layered decoder 1106. Selective layered decoding scheduler 1104 obtains one or more cost functions, evaluates the cost function(s), selects a group to be decoded next based on the cost function(s), and sends the selected group to LDPC layered decoder 1106 to be decoded.

The cost function evaluated by selective layered decoding scheduler 1104 can be any of the cost functions described in the present application. In some embodiments, the group with the least number of unsatisfied check nodes is selected. In some embodiments, an average of the reliability values associated with variable nodes is determined first for all groups, and then the group with the largest average is selected. In some embodiments, the group with the least number of reliability values below a threshold is selected. In some embodiments, the group with the largest of the smallest reliabilities is selected.

Figure 13:
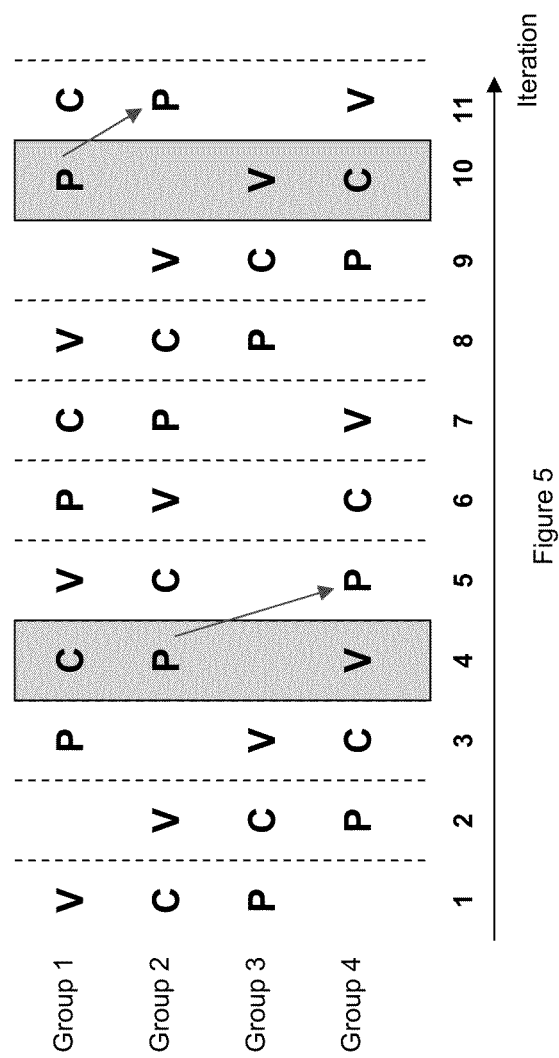
FIG. 13 is a diagram showing an exemplary embodiment of selective layered decoding scheduling.

FIG. 13 is a diagram showing an exemplary embodiment of selective layered decoding scheduling. It shows a schedule for LDPC layered decoding when an LDPC matrix is partitioned into four groups of check node layers.

In FIG. 13, a variable node update is indicated by a "V"; a check node update is indicated by a "C"; and a group prefetch is indicated by a "P." A group prefetch P is performed first. P selects the next group for which a check node update is performed. It prepares for a check node update to be performed on the selected group during the next layer iteration.

Therefore, if P is performed on a particular group during the $n^{th}$ layer iteration, a C is performed on the same group during the $(n+1)^{th}$ iteration, and a V is performed on the same group during the $(n+2)^{th}$ iteration. For example, as shown in FIG. 13, a P is performed on Group 3 during the $1^{st}$ layer iteration, a C is performed on Group 3 during the $2^{nd}$ layer iteration, and a V is performed on Group 3 during the $3^{rd}$ layer iteration. Similarly, P, C, and V are performed one after the other for Group 4 during the $2^{nd}$ to $4^{th}$ layer iterations.

As shown in FIG. 13, V, C, and P can be performed simultaneously during a particular layer iteration. In some embodiments, V, C, and P are each performed on a different group during that layer iteration. For example, during the $1^{st}$ layer iteration, a V is performed on Group 1, a C is performed on Group 2, and a P is performed on Group 3.

As described above, P selects the next group for which a check node update is performed. It prepares for a check node update to be performed on the selected group during the next layer iteration. In some embodiments, P selects the next group based on a cost function only once in every few layer iterations. In some embodiments, P selects the next group based on a cost function at each layer iteration.

In the exemplary schedule shown in FIG. 13, P selects the next group based on a cost function only once in every few layer iterations. In particular, P selects the next group based on a cost function after all of the groups have a variable node update at least once. For example, each of the groups has a variable node update at least once after the $4^{th}$ iteration; therefore, P selects Group 4 based on a cost function during the $5^{th}$ iteration, and Group 3 is skipped. Similarly, each of the groups has a variable node update at least once from the $5^{th}$ to the $10^{th}$ layer iteration. Accordingly, P selects Group 2 based on a cost function during the $11^{th}$ layer iteration.

Note that some groups may not be eligible for P to select from based on a cost function. For example, during the $5^{th}$ iteration, P may be limited to only selecting Group 3 or Group 4 because Group 1 has a variable node update and Group 2 has a check node update performed at that time.

Figure 14:
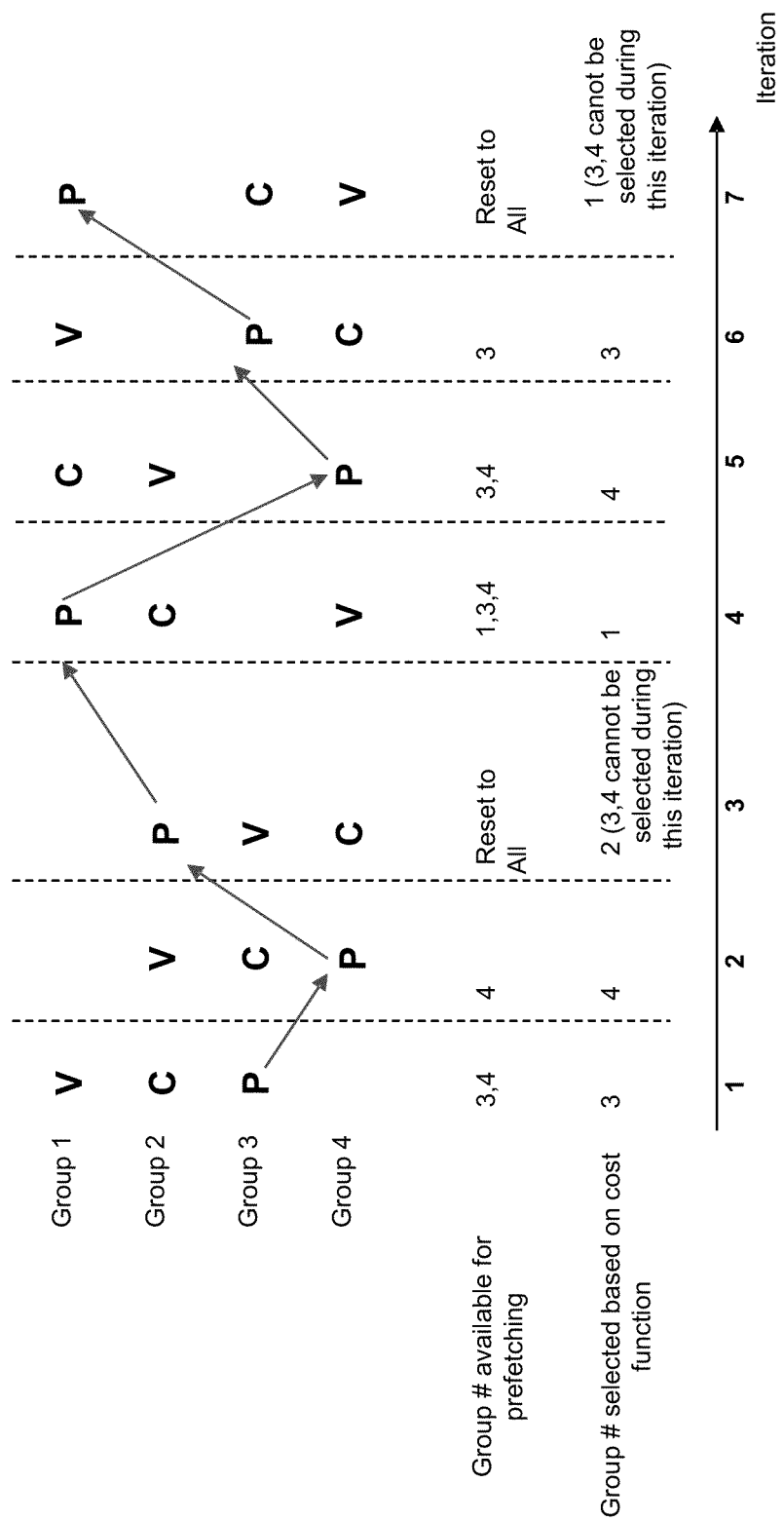
FIG. 14 is a diagram showing a second exemplary embodiment of selective layered decoding scheduling.

FIG. 14 is a diagram showing a second exemplary embodiment of selective layered decoding scheduling. In this example, P selects the next group based on a cost function at each layer iteration.

During each iteration, a subset of the groups may not be eligible for P to select from based on a cost function. For example, during the $1^{st}$ layer iteration, a variable node update is performed on Group 1, and a check node update is performed on Group 2; therefore, the groups available for prefetching are Group 3 and Group 4 only, and P selects Group 3 based on a cost function. During the $2^{nd}$ layer iteration, the groups available for prefetching is reduced to Group 4 only because prefetching a Group twice within the iterations between resetting the groups for prefetch selection to all groups is not preferred in this embodiment. During the $3^{rd}$ layer iteration, the groups available are reset back to all four groups. Similarly, during the $6^{th}$ layer iteration, the groups available for prefetching are reduced to Group 3 only because prefetching Group 2 twice within the iterations between resetting the groups for prefetch selection to all groups is not preferred in this embodiment. During the $7^{th}$ layer iteration, the groups available for prefetching are reset back to all four groups.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for decoding data, comprising:
   partitioning a low-density parity check (LDPC) matrix by a processor into a plurality of groups, each comprising one or more check node layers;
   selecting by the processor one of the groups based at least in part on a cost function, the cost function based at least in part on information associated with a variable node, or information associated with a check node, or both; and
   performing by the processor LDPC layered decoding, wherein in a current layer iteration of the LDPC layered decoding, a check node update is performed on a current layer, wherein in a next layer iteration of the LDPC layered decoding, a check node update is not performed on the next sequential layer following the current layer but performed on the selected group, and wherein in the next layer iteration of the LDPC layered decoding, a variable node update is not performed on the selected group but performed on the current layer.

2. The method of claim 1, wherein one of the one or more check node layers comprises a plurality of circulant matrices, wherein a circulant matrix comprises a square matrix.

3. The method of claim 2, wherein each of the plurality of circulant matrices has a column weight of one.

4. The method of claim 1, wherein each of the plurality of groups has a predetermined group column weight.

5. The method of claim 4, wherein the predetermined group column weight is one or two.

6. The method of claim 4, wherein performing LDPC layered decoding on the selected group comprises decoding a predetermined number of check node layers in the selected group, wherein the predetermined number of check node layers is equal to the predetermined group column weight.

7. The method of claim 6, wherein the predetermined number of check node layers in the selected group are selected by a multiplexer (MUX) structure.

8. The method of claim 1, wherein performing LDPC layered decoding on the selected group comprises:
   performing a group prefetch for a check node update for the selected group during a first layer iteration;
   performing the check node update during a second layer iteration; and
   performing a variable node update corresponding to the check node update during a third layer iteration, wherein the first layer iteration, the second layer iteration, and the third layer iteration are in sequential order.

9. The method of claim 8, further comprising:
   performing a check node update for a first group other than the selected group during the first layer iteration; and
   performing a variable node update for a second group other than the selected group during the first layer iteration.

10. The method of claim 1, wherein the selected group is selected based on the cost function after all of the groups have had a variable node update at least once.

11. The method of claim 1, wherein a subset of the groups is not eligible for selection based on the cost function.

12. The method of claim 1, wherein the LDPC matrix is constructed in such a way that the number of groups is reduced.

13. A system for decoding data, comprising:
   an interface configured to partition a low-density parity check (LDPC) matrix into a plurality of groups, each comprising one or more check node layers;
   a selective layered decoding scheduler configured to select one of the groups based at least in part on a cost function, the cost function based at least in part on information associated with a variable node, or information associated with a check node, or both; and
   an LDPC layered decoder configured to perform LDPC layered decoding, wherein in a current layer iteration of the LDPC layered decoding, a check node update is performed on a current layer, wherein in a next layer iteration of the LDPC layered decoding, a check node update is not performed on the next sequential layer following the current layer but performed on the selected group, and wherein in the next layer iteration of the LDPC layered decoding, a variable node update is not performed on the selected group but performed on the current layer.

14. The system of claim 13, wherein one of the one or more check node layers comprises a plurality of circulant matrices, wherein a circulant matrix comprises a square matrix.

15. The system of claim 14, wherein each of the plurality of circulant matrices has a column weight of one.

16. The system of claim 13, wherein each of the plurality of groups has a predetermined group column weight.

17. The system of claim 16, wherein the predetermined group column weight is one or two.

18. The system of claim 16, wherein performing LDPC layered decoding on the selected group comprises decoding a predetermined number of check node layers in the selected group, wherein the predetermined number of check node layers is equal to the predetermined group column weight.

19. The system of claim 18, further comprising a multiplexer (MUX) structure configured to select the predetermined number of check node layers in the selected group.

20. The system of claim 13, wherein performing LDPC layered decoding on the selected group comprises:
   performing a group prefetch for a check node update for the selected group during a first layer iteration;
   performing the check node update during a second layer iteration; and
   performing a variable node update corresponding to the check node update during a third layer iteration, wherein the first layer iteration, the second layer iteration, and the third layer iteration are in sequential order.

21. The system of claim 20, wherein the LDPC layered decoder is configured to:
   perform a check node update for a first group other than the selected group during the first layer iteration; and
   perform a variable node update for a second group other than the selected group during the first layer iteration.

22. The system of claim 13, further comprising a check node memory block coupled with the selective layered decoding scheduler and the LDPC layered decoder, wherein the check node memory is configured to store results of check node updates.

23. A computer program product for decoding data, the computer program product being embodied in a non-transitory computer readable storage medium and comprising computer instructions for:
   partitioning a low-density parity check (LDPC) matrix into a plurality of groups, each comprising one or more check node layers;
   selecting one of the groups based at least in part on a cost function, the cost function based at least in part on information associated with a variable node, or information associated with a check node, or both; and
   performing LDPC layered decoding , wherein in a current layer iteration of the LDPC layered decoding, a check node update is performed on a current layer, wherein in a next layer iteration of the LDPC layered decoding, a check node update is not performed on the next sequential layer following the current layer but performed on the selected group, and wherein in the next layer iteration of the LDPC layered decoding, a variable node update is not performed on the selected group but performed on the current layer.

* * * * *